(12) United States Patent
Kanazawa et al.

(10) Patent No.: US 11,811,190 B2
(45) Date of Patent: *Nov. 7, 2023

(54) LIGHT-EMITTING DEVICE

(71) Applicant: NICHIA CORPORATION, Anan (JP)

(72) Inventors: Tatsuya Kanazawa, Anan (JP); Kazuma Kozuru, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,275

(22) Filed: Sep. 7, 2022

(65) Prior Publication Data

US 2023/0006415 A1 Jan. 5, 2023

Related U.S. Application Data

(63) Continuation of application No. 17/122,704, filed on Dec. 15, 2020, now Pat. No. 11,476,637.

(30) Foreign Application Priority Data

Dec. 16, 2019 (JP) .................................. 2019-226575
Oct. 12, 2020 (JP) .................................. 2020-171614

(51) Int. Cl.
*H01S 5/00* (2006.01)
*H01S 5/02234* (2021.01)
(Continued)

(52) U.S. Cl.
CPC ........ *H01S 5/02234* (2021.01); *H01S 5/0236* (2021.01); *H01S 5/02253* (2021.01);
(Continued)

(58) Field of Classification Search
CPC ............. H01S 5/02234; H01S 5/02253; H01S 5/02257; H01S 5/0236; H01S 5/02255; H01S 5/4031

See application file for complete search history.

(56) References Cited

U.S. PATENT DOCUMENTS 6,004,046 A * 12/1999 Sawada ................ G02B 6/4214
385/92
6,354,747 B1 3/2002 Irie et al.
(Continued)

FOREIGN PATENT DOCUMENTS

JP H06-124455 A 5/1994
JP H06-331869 A 12/1994
(Continued)

OTHER PUBLICATIONS

Notice of Allowance on U.S. Appl. No. 17/122,704 dated Jun. 13, 2022.

*Primary Examiner* — Kinam Park
(74) *Attorney, Agent, or Firm* — Foley & Lardner LLP

(57) ABSTRACT

A light-emitting device includes: a plurality of semiconductor laser elements; a package having a hermetically sealed space, with the plurality of semiconductor laser elements arranged in the space; an optical member fixed to the package; and a plurality of adhesives including a first adhesive and a second adhesive fixing the optical member to the package. The plurality of adhesives are bonded to the optical member between an emission surface of the package and an incidence surface or a lower surface of the optical member. In the optical member, one or more first bonding regions to which the first adhesive is bonded and one or more second bonding regions to which the second adhesive is bonded are located at positions that are closer to the incidence surface of the optical member than to an emission surface of the optical member.

13 Claims, 7 Drawing Sheets

(51) Int. Cl.
*H01S 5/02253* (2021.01)
*H01S 5/02257* (2021.01)
*H01S 5/0236* (2021.01)
*H01S 5/40* (2006.01)
*H01S 5/02255* (2021.01)

(52) U.S. Cl.
CPC ...... *H01S 5/02257* (2021.01); *H01S 5/02255* (2021.01); *H01S 5/4031* (2013.01)

(56) References Cited

U.S. PATENT DOCUMENTS

| | | | | |
|---|---|---|---|---|
| 6,448,583 | B1* | 9/2002 | Yoneda | G02B 6/4212 |
| | | | | 257/98 |
| 11,476,637 | B2* | 10/2022 | Kanazawa | H01S 5/0236 |
| 2001/0025650 | A1* | 10/2001 | Ando | G02B 6/4239 |
| | | | | 257/432 |
| 2002/0003705 | A1 | 1/2002 | Tanaka | |
| 2002/0020493 | A1* | 2/2002 | Ichihara | G02B 6/4239 |
| | | | | 428/57 |
| 2004/0195580 | A1* | 10/2004 | Nishizawa | H01S 5/02257 |
| | | | | 257/99 |
| 2005/0242359 | A1* | 11/2005 | Yoshida | H01S 5/02212 |
| | | | | 257/99 |
| 2006/0159406 | A1* | 7/2006 | Nishie | G02B 6/4292 |
| | | | | 385/88 |
| 2011/0317727 | A1* | 12/2011 | Furuya | H01S 3/109 |
| | | | | 372/27 |
| 2012/0320719 | A1* | 12/2012 | Arai | G11B 5/4866 |
| 2017/0317467 | A1 | 11/2017 | Miura et al. | |
| 2018/0287335 | A1 | 10/2018 | Kozuru et al. | |
| 2019/0103723 | A1 | 4/2019 | Miura et al. | |
| 2019/0195442 | A1 | 6/2019 | Miura | |

FOREIGN PATENT DOCUMENTS

| | | |
|---|---|---|
| JP | H08-234059 A | 9/1996 |
| JP | H10-213724 A | 8/1998 |
| JP | H11-176851 A | 7/1999 |
| JP | H11-186609 A | 7/1999 |
| JP | 2000-155251 A | 6/2000 |
| JP | 2001-281505 A | 10/2001 |
| JP | 2002-090587 A | 3/2002 |
| JP | 2006-085003 A | 3/2006 |
| JP | 2006-190783 A | 7/2006 |
| JP | 2007-127925 A | 5/2007 |
| JP | 2017-032871 A | 2/2017 |
| JP | 2017-201684 A | 11/2017 |
| JP | 2018-170426 A | 11/2018 |
| JP | 2019-114726 A | 7/2019 |

* cited by examiner

LIGHT-EMITTING DEVICE

CROSS-REFERENCE TO RELATED APPLICATIONS

This application is a continuation of U.S. patent application Ser. No. 17/122,704, filed on Dec. 15, 2020, which claims priority to Japanese Patent Application No. 2019-226575, filed on Dec. 16, 2019, and Japanese Patent Application No. 2020-171614, filed on Oct. 12, 2020. The disclosures of these applications are hereby incorporated by reference in their entireties.

BACKGROUND

The present disclosure relates to a light-emitting device.

Japanese Patent Publication No. 2017-201684 discloses positioning a package including a hermetically sealed space that accommodates semiconductor laser elements therein and an optical member relative to each other, and then bonding the package and the optical member together using an adhesive of a UV-curable resin. According to Japanese Patent Publication No. 2017-201684, it is possible to perform positioning and then fixing these components, thus realizing a high-precision packaging.

Light-emitting devices including light-emitting elements such as semiconductor laser elements are incorporated in various products such as projectors and headlights for automobiles.

SUMMARY

It is possible to realize a light-emitting device with stable adhesion.

A light-emitting device according to an embodiment of the present disclosure includes: a semiconductor laser element; a package having a hermetically sealed space, with the semiconductor laser element arranged in the space; an optical member fixed to the package; and a first adhesive and a second adhesive for fixing the optical member to the package, the second adhesive having a better resistance to light than the first adhesive does. Light from the semiconductor laser element exits to outside through an emission surface of the package. The light exiting to the outside through the emission surface of the package is incident on an incidence surface of the optical member and exits through an emission surface of the optical member. The first adhesive and the second adhesive are bonded to the optical member between the emission surface of the package and the incidence surface of the optical member. In the optical member, one or more first bonding regions to which the first adhesive is bonded and one or more second bonding regions to which the second adhesive is bonded are provided at positions that are closer to the incidence surface of the optical member than to the emission surface of the optical member. In the optical member, the one or more first bonding regions and the one or more second bonding regions have a light transmittance of 80% or more.

According to the present invention, it is possible to realize a light-emitting device with stable adhesion.

DETAILED DESCRIPTION

For the scope of the present specification and the claims, the term "polygon" (e.g., a triangle or a rectangle) encompasses those with rounded corners, chamfered corners, beveled corners or round chamfered corners. The term "polygon" also encompasses those in which an intermediate portion of a side (as opposed to a corner, i.e., the end of the side), is processed. That is, any shape that is obtained by partially processing a polygon falls within the meaning of a "polygon" as defined in the present specification and the claims.

This applies not only to "polygon" but also to any term representing a particular shape such as a trapezoid, a circle or a convex/concave shape. This also applies when referring to a side of a shape. That is, even a corner or an intermediate portion of a side is processed, the "side" is defined to include the processed portion. Note that the term "in the strict sense" (e.g., "a rectangle in the strict sense") may be used to refer to a "polygon" or a "side" without under partial process, as opposed to a "polygon" or a "side" that is partially processed.

Where there is more than one of the same component, they may be prefixed with "first," "second," etc., in order to distinguish them from one another in the present specification or the claims. Where how the distinction is made in the present specification is different from that in the claims, the same prefix may not refer to the same member in the present specification and in the claims.

For example, if members of the same component are prefixed with "first," "second," and "third" in the specification, and if a claim only recites the "first" member and the "third" member as defined in the specification, the claim may instead use "first" and "second" to refer to the "first" member and the "third" member.

Embodiments of the present invention will now be described with reference to the drawings. Note however that the illustrated embodiments embody the technical concept of the present invention but are not intended to limit the scope of the present invention. In the following description, like reference signs denote like elements, and redundant descriptions may be omitted. Note that the size, relative arrangement, etc., of the members shown in the figures may be exaggerated in order to facilitate the understanding.

EMBODIMENTS

Figure 1:
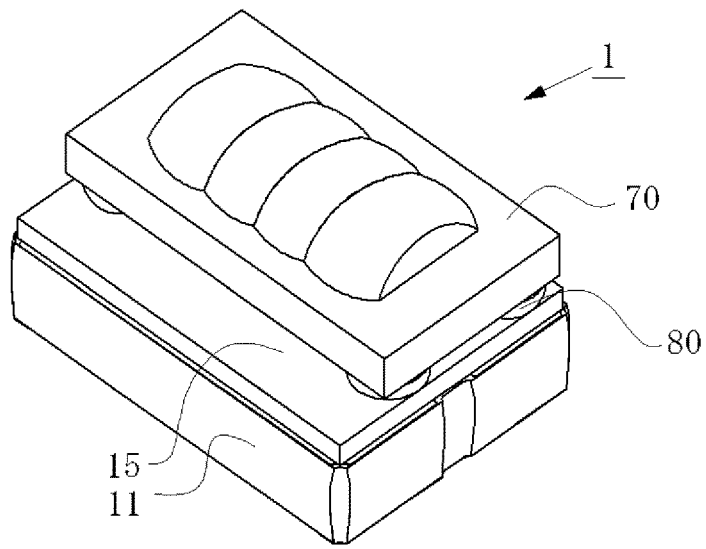
FIG. 1 is a perspective view showing a light-emitting device according to an embodiment.
Figure 2:
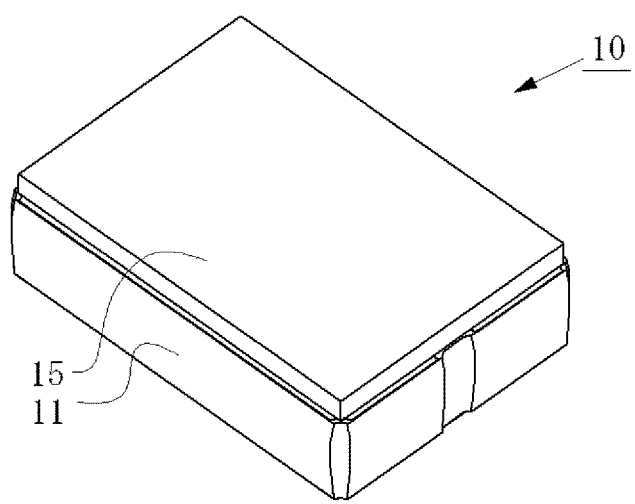
FIG. 2 is a perspective view showing a package according to the embodiment.
Figure 3:
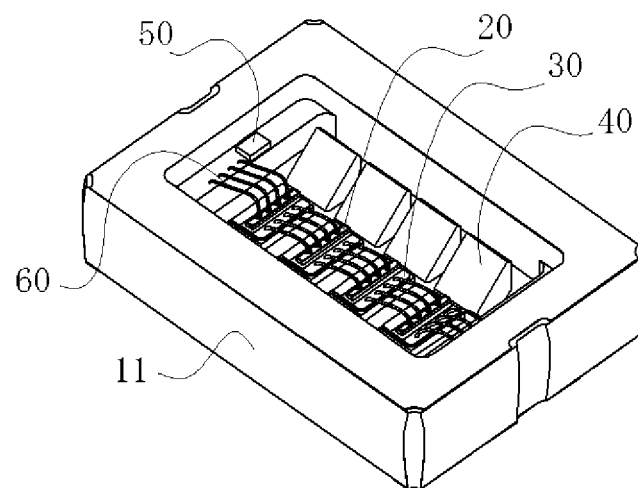
FIG. 3 is a perspective view showing the package according to the embodiment without showing a lid member.
Figure 4:
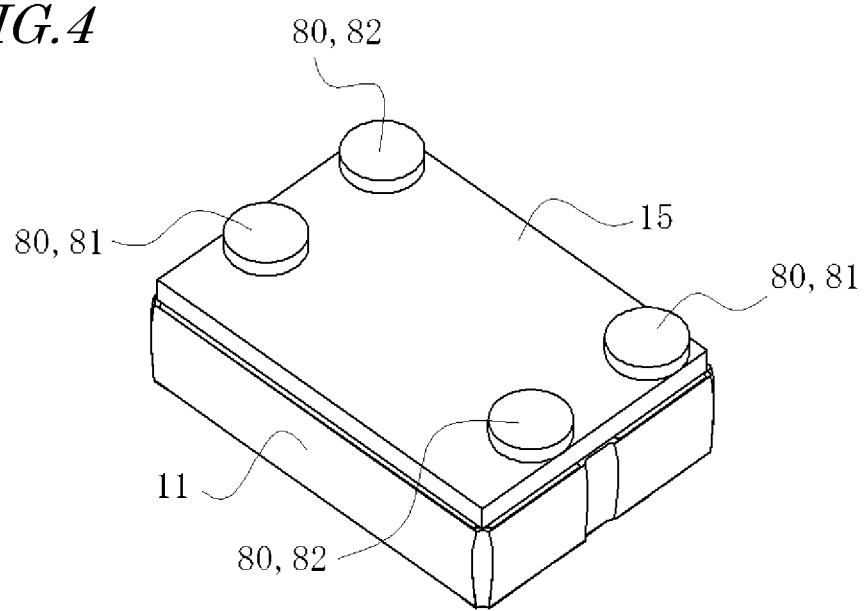
FIG. 4 is a perspective view showing the light-emitting device according to the embodiment without showing an optical member.
Figure 5:
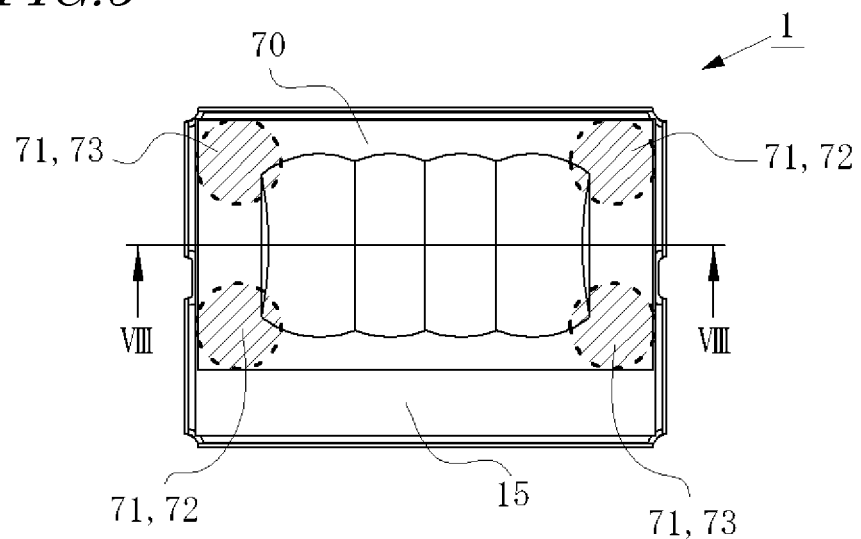
FIG. 5 is a top view showing the light-emitting device according to the embodiment.
Figure 6:
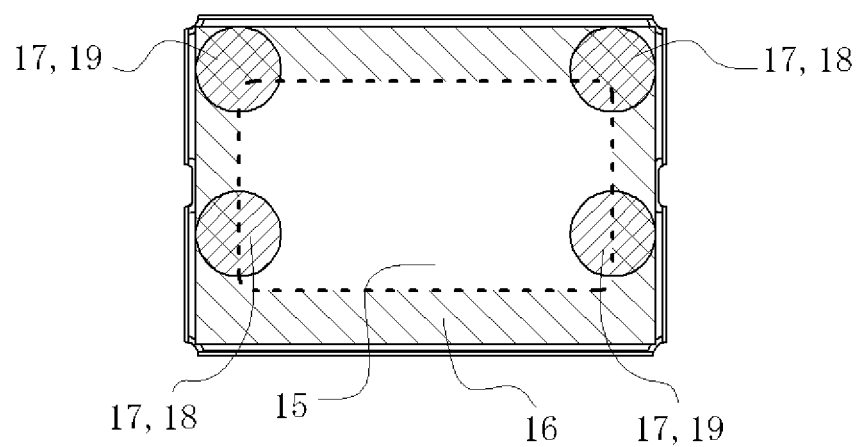
FIG. 6 is a top view showing the package according to the embodiment.
Figure 7:
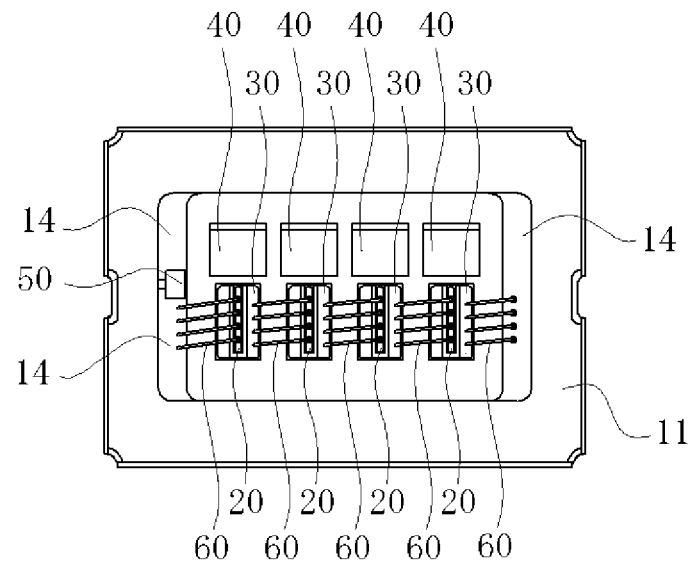
FIG. 7 is a top view showing the package according to the embodiment without showing the lid member.
Figure 8:
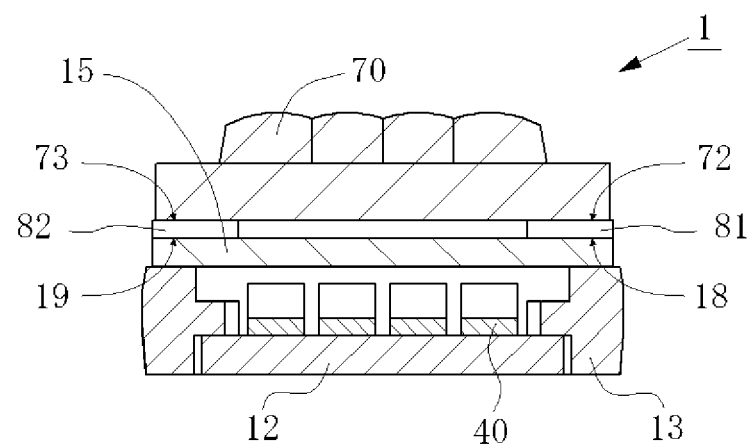
FIG. 8 is a cross-sectional view showing the light-emitting device taken along line VIII-VIII of FIG. 5.

A light-emitting device 1 according to an embodiment will be described. FIG. 1 to FIG. 8 are views illustrating an exemplary embodiment of the light-emitting device 1. FIG. 1 is a perspective view showing the light-emitting device 1. FIG. 2 is a perspective view showing a package 10 of the light-emitting device 1. FIG. 3 is a perspective view showing the package 10 without showing the lid member 15. FIG. 4 is a perspective view showing the light-emitting device 1 without showing the optical member 70 so as to illustrate positions of adhesives 80 provided in the package 10. FIG. 5 is a top view showing the light-emitting device 1. FIG. 6 is a top view showing the package 10. FIG. 7 is a top view in a state similar to FIG. 3. FIG. 8 is a cross-sectional view taken along line VIII-VIII of FIG. 5.

Each hatched region that is delimited by a dotted line in FIG. 5 represents a bonding region 71 of the optical member 70. Each hatched region that is delimited by a solid line in FIG. 6 represents a bonding region 17 of the lid member 15. In addition to the hatching of the bonding regions 17, the hatched region that is defined between a dotted line and the outline of the lid member 15 represents a region where a metal film 16 of the lid member 15 is to be provided.

The light-emitting device 1 has components including the package 10, semiconductor laser elements 20, submounts 30, reflective members 40, a protection element 50, wire(s) 60, the optical member 70, and adhesives 80. The package 10 includes a base 11 and the lid member 15.

The semiconductor laser elements 20, the submounts 30, the protection element 50 and the wires 60 are disposed in a hermetically sealed closed space that is formed by the package 10. The optical member 70 is fixed to the package 10 via the adhesives 80.

In the illustrated example of the light-emitting device 1, four semiconductor laser elements 20 are arranged in an array in a space that is hermetically sealed by the base 11 and the lid member 15. Each of the semiconductor laser elements 20 are arranged on the base 11 with the submount 30 interposed therebetween. The reflective members 40 are located so as to reflect light emitted from the semiconductor laser elements 20. Light emitted from the semiconductor laser elements 20 passes through the lid member 15 to be emitted to the outside of the package 10.

The optical member 70 is bonded to the lid member 15 via the adhesives 80. Two types of adhesives 80, i.e., first adhesives 81 and second adhesives 82, are used to bond the optical member 70 and the lid member 15 together. The light emitted to the outside of the package 10 passes through the optical member 70 to be emitted to the outside of the light-emitting device 1.

First, each component will be described.
(Base 11)

The base 11 has an arrangement region, which is a region where other components are arranged, and a lateral wall that surrounds the arrangement region. The base 11 has a recessed-shape portion, and the recessed-shape portion is defined by the arrangement region and the lateral wall. The recessed-shape portion recesses in the direction from the upper surface to the lower surface of the base 11. The surface defining the bottom of the recession of the recessed-shape portion is herein referred to as the bottom surface. The bottom surface can be the arrangement region or a primary portion of the arrangement region.

The outer shape of the base 11 is rectangular in a top view. The outer shape of the recession of the recessed-shape portion is rectangular in a top view. The outer shape of the bottom surface of the base 11 is rectangular in a top view. The outer shape of the bottom surface is smaller than the outer shape of the recession of the recessed-shape portion. These outer shapes do not need to be rectangular.

The base 11 includes a bottom portion 12 and a lateral portion 13. The bottom portion 12 is a portion that forms the bottom surface of the base 11. The bottom portion 12 includes the bottom surface of base 11 and a portion of the lower surface of the base 11. The bottom portion 12 has a flat plate shape. The flat plate is smaller than the outer lateral surface(s) of the base 11 in a top view.

The lateral portion 13 is a portion that forms the lateral wall of the base 11. Therefore, the lateral portion 13 surrounds the bottom surface of the base 11 and extends upward from the bottom surface. The lateral portion 13 includes one or more outer lateral surfaces and one or more inner lateral surfaces of the base 11, and an upper surface meeting the outer lateral surface and the inner lateral surface. The lateral portion 13 also includes a portion of the lower surface of the base 11.

The number of inner lateral surface(s) or outer lateral surface(s) of the base 11 depends on the shape that surrounds the bottom surface. For example, if the shape that surrounds the bottom surface is rectangular, a plurality of inner lateral surfaces are formed corresponding to the four sides of the rectangular shape. For example, if the shape that surrounds the bottom surface is circular, one inner lateral surface is formed corresponding to the single circle. This similarly applies to the outer lateral surface.

A plurality of wiring regions 14 are provided on the base 11. One or more wiring regions 14 are provided on the recessed portion of the recessed-shape portion, and one or more wiring regions are provided outside the recessed portion. The wiring regions 14 provided on the recessed portion are electrically connected to the wiring regions provided outside the recessed portion.

In the illustrated example of the light-emitting device 1, a plurality of wiring regions 14 are provided on the recessed portion of the recessed-shape portion formed by the bottom surface and the inner lateral surface. A plurality of wiring regions are provided on the lower surface of the base 11 outside the recessed portion. The wiring regions can be provided on the upper surface or the outer lateral surface, for example, as well as on the lower surface of the base 11.

The bottom portion 12 and the lateral portion 13 of the base 11 are formed of main materials different from each other. For example, the main material of the bottom portion 12 can be a ceramic, and the main material of the lateral portion 13 can be a metal. The base 11 can be formed by bonding together the bottom portion 12 and the lateral portion 13. As one example, a base 11 in which the bottom portion 12 and the lateral portion 13 are formed as an integral member can be employed. In such a case, the main material can be a ceramic, for example.

Examples of the ceramic that can be used include, for example, aluminum nitride, silicon nitride, aluminum oxide, silicon carbide, etc. The usable metal can be, for example, copper, aluminum, iron, or, as a composite, copper molybdenum, copper-diamond composite, copper tungsten, or the like. The metal employed for the bottom portion 12 is preferably a metal that has better heat dissipation (a higher thermal conductivity) than the ceramic employed for the lateral portion 13.

A metal film is provided in the wiring regions 14 of the base 11 and at locations that correspond to the wiring regions and are to be electrically connected to the wiring regions 14. A metal is also provided running through the inside of the package 10 for electrical connection.

(Lid Member 15)

The lid member 15 has a lower surface and an upper surface, and is formed in a flat plate shape that is a rectangular parallelepiped. Note that it does not need to be a rectangular parallelepiped. The lid member 15 may be translucent. Thus, it can be said that the lid member 15 is a light transmissive member. Note that the member 15 can be a light transmissive member that does not serve as a lid.

Being translucent, as used herein, means that the light transmittance is 80% or more. Note that it does not have to mean that the transmittance is 80% or more for every wavelength. The lid member 15 can partially include a non-light-transmissive region (a region that is not translucent).

The metal film 16 is provided on a partial region of the surface of the lid member 15. The metal film 16 is provided for bonding with other components. Therefore, part or whole of the region where the metal film 16 is provided serves as the bonding region to be bonded to another component. The metal film 16 is provided on the lower surface of the lid member 15. The metal film 16 is provided in an annular shape along the outer edge of the lid member 15. The portion of the lid member 15 directly above the metal film 16 may be translucent.

The lid member 15 can be formed of sapphire. Sapphire is translucent and is material that has a relatively high refractive index and a relatively high mechanical strength. Note that other than sapphire, glass, or the like, can be used, for example. The metal film 16 can be formed of Ti/Pt/Au, for example.

(Semiconductor Laser Element 20)

The semiconductor laser element 20 has a rectangular outer shape in a top view. The lateral surface defined by one of the short sides of the rectangular shape serves as the emission end face from which light of the semiconductor laser element 20 is emitted. The upper surface and the lower surface of the semiconductor laser element 20 respectively have a larger area than the emission end face.

A light beam (laser beam) emitted from the semiconductor laser element 20 diverges and forms an elliptical far field pattern (hereinafter "FFP") on a plane that is parallel to the light emission end face. FFP represents the shape or the optical intensity distribution at a position distant from the emission end face.

Herein, light that passes through the center of the elliptical shape of the FFP, in other words, light of the peak intensity on the optical intensity distribution of the FFP, is referred to as light that travels along the optical axis. On the optical intensity distribution of the FFP, light that has an intensity of $1/e^2$ or more relative to the peak intensity value is referred to as a primary portion of light.

The FFP of light emitted from the semiconductor laser element 20 has an elliptical shape that is longer in the stack direction of a plurality of semiconductor layers including the active layer than in the in-layer direction of the semiconductor layers perpendicular to the stack direction. Note that the in-layer direction is referred to as the lateral direction of the FFP, and the stack direction as the vertical direction of the FFP.

Based on the optical intensity distribution of the FFP, the angle that corresponds to the full width at half maximum of the optical intensity distribution is referred to as the divergence angle of light from the semiconductor laser element. The divergence angle of light in the vertical direction of the FFP is referred to as the divergence angle in the vertical direction, and the divergence angle of light in the lateral direction of the FFP as the divergence angle in the lateral direction.

For example, semiconductor laser elements that emit blue light, semiconductor laser elements that emit green light or semiconductor laser elements that emit red light can be employed as the semiconductor laser elements 20. Semiconductor laser elements that emit other light can be employed.

Herein, blue light refers to light whose emission peak wavelength is in the range of 420 nm to 494 nm. Green light refers to light whose emission peak wavelength is in the range of 495 nm to 570 nm. Red light refers to light whose emission peak wavelength is in the range of 605 nm to 750 nm.

Examples of semiconductor laser elements that emit blue light or semiconductor laser elements that emit green light include semiconductor laser elements using a nitride semiconductor. A nitride semiconductor can be, for example, GaN, InGaN, or AlGaN. Examples of semiconductor laser elements that emit red light include those using an InAlGaP-based semiconductor, a GaInP-based semiconductor, a GaAs-based semiconductor or an AlGaAs-based semiconductor.

Note that although the semiconductor laser element 20 is a single emitter including one emitter, it can be a multi-emitter including two or more emitters. Where the semiconductor laser element 20 includes a plurality of emitters, a laser beam that forms an elliptical-shaped FFP is emitted from the emission end face of each emitter.

(Submount 30)

The submount 30 has two bonding surfaces and has a rectangular parallelepiped shape. One bonding surface is provided on the opposite side of the other bonding surface. The distance between the two bonding surfaces is smaller than the distance of any other two surfaces opposing each other. Note that the shape of the submount 30 is not limited to a rectangular parallelepiped. The submount 30 can be formed by using, for example, silicon nitride, aluminum nitride or silicon carbide. A metal film for bonding is provided on the bonding surfaces.

(Reflective Member 40)

The reflective member 40 has a light-reflecting surface that reflects light. The light-reflecting surface is inclined relative to the lower surface. That is, the light-reflecting surface is neither vertical nor parallel to the lower surface. For example, the light-reflecting surface is a flat surface provided on a slope that is inclined by 45 degrees relative to the lower surface. Note that the light-reflecting surface can be a curved surface as opposed to a flat surface. The angle of inclination is not limited to 45 degrees. Where the light-reflecting surface is a curved surface, it can include a portion or portions that are locally vertical or locally parallel to the lower surface.

The reflective member 40 can be formed of a glass or a metal as its main material. The main material is preferably a heat-resistant material, e.g., quartz or a glass such as BK7 (borosilicate glass), or a metal such as aluminum. The reflective member 40 may be formed by using Si as its main material. The light-reflecting surface can be formed by using, for example, a metal such as Ag or Al, or a dielectric multilayer film such as $Ta_2O_5/SiO_2$, $TiO_2/SiO_2$ or $Nb_2O_5/SiO_2$.

The optical reflectance of the light-reflecting surface with respect to the peak wavelength of the laser beam to be reflected is 95% or more. It may be possible to achieve an optical reflectance of 99% or more. The optical reflectance is 100% or less, or less than 100%.

(Protection Element 50)

The protection element 50 can prevent an excessive current flow from running through and breakage of a particular element (e.g., a semiconductor laser element 20). Examples of the protection element 50 include, for example, a Zener diode. The Zener diode can be a Zener diode formed by using Si.

(Wire 60)

The wire 60 has a linear shape whose opposite ends are bonding portions. That is, the opposite ends of the linear portion each serve as a bonding portion with another component. The wire 60 is a metal wire, for example. The metal can be, for example, gold, aluminum, silver, copper, etc.

(Optical Member 70)

The optical member 70 has an upper surface, a lower surface, and a lateral surface. It also has a lens surface. The lens surface meets a flat surface. For example, the upper surface, which is a flat surface meeting the lateral surface, meets the lens surface. In such a case, it can be said that the upper surface of the optical member 70 includes a region of the flat surface and a region of the lens surface. Note that the optical member 70 can include a lens surface on the lower surface instead of, or in addition to, on the upper surface. The upper surface can be formed only of the lens surface.

The optical member 70 as a whole has a shape that includes semi-circular lenses formed on the flat plate-shaped upper surface. Note that where these portions are referred to as the lens portion and the flat plate portion, respectively, the flat upper surface that meets the lateral surface corresponds to the upper surface of the flat plate portion, and the upper surface that is formed by the lens surface corresponds to the upper surface of the lens portion. The optical member 70 includes the flat plate portion and the lens portion formed as an integral member. Note that these portions can be formed separately and bonded together.

The outer shape of the optical member 70 is rectangular, in a top view or as viewed from below. Note that it does not need to be rectangular. It can be said that the lens portion is a portion that overlaps the lens surface in a top view. A portion of the optical member 70 other than the lens portion will be referred to as a non-lens portion.

The lens surface includes a plurality of lenses that are continuous with each other. The lens surface includes the lenses arranged in an array. The lenses are arranged in the same direction. The length of the lens surface in the direction in which the lenses are arranged with each other is longer than the longitudinal dimension of each lens (i.e., the length in the direction perpendicular to the direction in which the lenses are arranged with each other). Note that the length of the lens surface in the direction in which the lenses are arranged with each other may be shorter than the longitudinal dimension of each lens.

The optical member 70 may be translucent. The optical member 70 may be translucent through both the lens portion and in the non-lens portion. The optical member 70 as a whole may be translucent. The optical member 70 can be formed by using a glass such as BK7, for example.

(Adhesive 80)

The adhesive 80 includes two types of adhesives, i.e., a first adhesive 81 and a second adhesive 82. Of the two adhesives, the first adhesive 81 is a UV-curable resin, and the second adhesive 82 is a thermosetting resin. Note that the combination of the first adhesive 81 and the second adhesive 82 is not limited to this. Hereinbelow, what applies to both of the first adhesive 81 and the second adhesive 82 will be discussed with reference to the adhesive 80.

The second adhesive 82 is an adhesive that has a better resistance to light than the first adhesive. The "resistance to light," as used herein, means that the adhesive 80 has a resistance to light after the adhesive 80 is bonded and the light-emitting device 1 is mounted. The second adhesive 82 can be an adhesive that has a better resistance to visible light (in the wavelength range of 400 nm or more and 760 nm or less) than the first adhesive. The second adhesive 82 can be an adhesive that has a better resistance to blue light than the first adhesive.

For example, a cured adhesive 80 may lose the bonding strength and no longer serve as an adhesive after being exposed to light of a predetermined energy density $[W/mm^2]$. If the first adhesive loses its function as an adhesive in a shorter length of time than the time taken for the second adhesive to lose its function under exposure of the same energy density, it can be said that the second adhesive 82 has a better resistance to light than the first adhesive 81 does.

As an adhesive formed of the UV-curable resin, an epoxy resin or an acrylate resin can be used. As an adhesive formed of the thermosetting resin, an epoxy resin or a silicone resin can be used.

(Light-Emitting Device 1)

Next, the light-emitting device 1 will be described.

The light-emitting device 1 includes the semiconductor laser element(s) 20, the package 10 in which the semiconductor laser element(s) 20 are disposed, and the optical member 70 fixed to the package 10. The optical member 70 is fixed to the package 10 using the adhesive 80. At least two types of adhesives 80, i.e., the first adhesive 81 and the second adhesive 82, are used for fixing the optical member 70. Note that another type of a light-emitting element, such as an LED, can be used instead of the semiconductor laser element 20.

The submount(s) 30, the reflective member(s) 40 and the protection element 50, in addition to the semiconductor laser element(s) 20, are disposed in the package 10. These components are disposed on the base 11 of the package 10. The semiconductor laser element(s) 20 and the protection element 50 are electrically connected to the wiring regions 14 via the wires 60.

After the semiconductor laser element(s) 20, the submount(s) 30, the reflective member(s) 40, the protection element(s) 50 and the wire(s) 60 are disposed on the base 11, the base 11 and the lid member 15 are bonded together, thereby sealing the space in which the semiconductor laser element(s) 20 is disposed, thus completing the package 10. The sealed space is formed by bonding together the base 11 and the lid member 15. The metal film 16 of the lid member 15 serves as the bonding region to be bonded to the base 11.

The light-emitting device 1 as described above is produced through the step of making the package 10 in which the semiconductor laser element 20 is disposed, the step of providing the package 10 in which the semiconductor laser element 20 is arranged, and the step of fixing the optical member 70 to the package 10.

When making the package 10, the semiconductor laser element 20 is disposed on the bottom surface (i.e., arrangement region) of the base 11. Note that a plurality of semiconductor laser elements 20 can be arranged. The semiconductor laser elements 20 can be arranged so that the emission end faces are facing in the same direction. Alternatively, the semiconductor laser elements 20 can be arranged so that the emission end faces oppose each other. The semiconductor laser elements 20 can be arranged so that the lateral surfaces meeting the emission end faces face each other between adjacent semiconductor laser elements 20.

In the illustrated example of the light-emitting device 1, four semiconductor laser elements 20 are arranged so that the emission end faces face in the same direction. The semiconductor laser elements 20 are arranged along the longitudinal direction of the package 10 in a top view. The lateral surfaces meeting the emission end faces and facing each other are parallel to each other in a top view, between adjacent semiconductor laser elements 20.

Each of the four semiconductor laser elements 20 is a semiconductor laser element that emits blue light. Note that where a plurality of semiconductor laser elements 20 are arranged in the package 10, the semiconductor laser elements 20 do not need to all emit light of the same color. The color of emission is not limited to blue but can be any other color. A plurality of semiconductor laser elements that emit light of colors different to each other can be arranged so as to realize a package 10 that emits light of several colors.

The submounts 30 are bonded to the semiconductor laser elements 20 on one bonding surface. On the other bonding surface on the opposite side, the submounts 30 are bonded to the bottom surface of the base 11. Only one semiconductor laser element 20 is arranged on each submount 30. Therefore, where a plurality of semiconductor laser elements 20 are provided, the same number of submounts 30 as the number of semiconductor laser elements 20 are provided. Note that a plurality of semiconductor laser elements 20 can be arranged on one submount 30.

In the illustrated example of the light-emitting device 1, one semiconductor laser element 20 is arranged on each submount 30, and the same number of the submounts 30 as the number of semiconductor laser elements 20 are bonded to the bottom surface of the base 11. The emission end face of each semiconductor laser element 20 is arranged in the vicinity of the edge of the submount 30 so that the primary portion of light emitted from the semiconductor laser element 20 does not irradiate the upper surface of the submount 30.

Note that the bonding of the submount 30 to the base 11 is performed after the semiconductor laser element 20 is bonded to the submount 30. Alternatively, the semiconductor laser element 20 can be bonded to the submount 30 after the submount 30 is bonded to the base 11. The semiconductor laser element 20 can be arranged directly on the bottom surface of the base 11 without the submount 30 interposed therebetween.

The reflective member 40 is arranged on the bottom surface of the base 11. The reflective member 40 is arranged in such an orientation that light emitted from the semiconductor laser element 20 irradiates the light-reflecting surface. The primary portion of light emitted from the semiconductor laser element 20 irradiates the light-reflecting surface of the reflective member 40.

One reflective member 40 corresponds to one semiconductor laser element 20, and the primary portion of light from one semiconductor laser element 20 irradiates the light-reflecting surface of one reflective member 40. Where a plurality of semiconductor laser elements 20 are provided, the same number of reflective members 40 as the number of semiconductor laser elements 20 may be provided. Note that the primary portion of light from a plurality of semiconductor laser elements 20 can irradiate one reflective member 40.

In the illustrated example of the light-emitting device 1, the semiconductor laser elements 20 respectively correspond to the reflective members 40, and four reflective members 40 are bonded to the bottom surface of the base 11. The reflective members 40 are arranged next to each other in the same direction as the direction in which the semiconductor laser elements 20 are arranged next to each other. The light-reflecting surface is inclined by an angle of 45 degrees relative to the light traveling direction in which the light travels through the optical axis.

In the illustrated example of the light-emitting device 1, the light-reflecting surface of the reflective member 40 reflects 98% or more of the primary portion of incident light. Light emitted in the lateral direction from the semiconductor laser element 20 is reflected upward by the reflective member 40. Note that the light-emitting device 1 can include no reflective member 40. In such a case, for example, the emission end faces of the semiconductor laser elements 20 are oriented toward the upper surface.

The protection element 50 can be arranged in a wiring region 14 of the base 11. The protection element 50 can be arranged in a wiring region 14 provided in the recessed portion of the recessed-shape portion. The protection element 50 can be arranged on two wiring regions 14, thereby electrically connecting the regions together. Note that the protection element 50 can be arranged on one wiring region 14 and connected to the other wiring region 14 via a wire. In the illustrated example of the light-emitting device 1, the protection element 50 is arranged so as to bridge between two wiring regions 14 in a top view.

The wire 60 can be bonded to a wiring region 14 of the base 11. The wire 60 can be bonded to a wiring region 14 provided in the recessed portion of the recessed-shape portion. The wire 60 can be bonded to a semiconductor laser element 20. The wire 60 can be bonded to a submount 30. The wire 60 can be provided for electrically connecting together the semiconductor laser element 20 and the wiring region 14. Where a plurality of semiconductor laser element 20 are provided, the wire 60 can electrically connect together the semiconductor laser elements 20 in series. Note that the electrical connection can be accomplished in a parallel connection.

The lid member 15 is arranged on the upper surface of the base 11. With the lid member 15 bonded, a closed space is produced surrounded by the base 11 and the lid member 15. Components arranged on the base 11, such as the semiconductor laser elements 20 and the reflective members 40, are enclosed in this space. The lid member 15 is bonded to the base 11 under a predetermined atmosphere, and this closed space becomes a hermetically sealed space. The semiconductor laser elements 20 are arranged in the hermetically sealed space, thereby preventing quality degradation due to dust collection.

The lid member 15 is bonded to the base 11 along the metal film 16. A metal film for bonding is also provided in a region where the base 11 is bonded to the lid member 15. The base 11 and the lid member 15 are bonded together by using a metal bonding material. For example, a metal bonding material of AuSn is disposed on the bonding region of the base 11, and the bonding region of the lid member 15 is laid on the bonding region, thereby bonding together the base 11 and the lid member 15. Note that the metal bonding material can be a solder, or the like, as well as a metal brazing material such as AuSn.

The lid member 15 may be translucent to light emitted from the semiconductor laser element 20. The primary portion of light emitted from the semiconductor laser element 20 passes through the light-transmitting region of the lid member 15 to exit from the upper surface of the lid member 15 to the outside of the package 10. It can be said that the lower surface of the lid member 15 is the surface of incidence to which light emitted from the semiconductor laser element 20 enters. Also, it can be said that the upper surface of the lid member 15 is the emission surface from which light emitted from the semiconductor laser element 20 exits In the illustrated example of the light-emitting device 1, for the bonding between the lid member 15 and the base 11, Ni plating is applied in the bonding region between the upper surface of the base 11 and the lower surface of the lid member 15. The region of the lid member 15 where the metal film 16 is provided or the region above the bonding region may be translucent. In other words, light emitted from above the lid member 15 toward the metal film 16 in the package 10 passes through the translucent region of the lid member 15 to reach the metal film 16.

In the package 10 produced as described above, light emitted from the semiconductor laser element 20 is reflected by the reflective member 40 to pass through the lid member 15 arranged above so as to be emitted upward of the package 10. 90% or more of the primary portion of light emitted from the semiconductor laser element 20 exits to the outside of the package 10. In the illustrated example of the light-emitting device 1, 98% or more exits to the outside of the package 10.

Subsequently, in the step of fixing the optical member 70 to the package 10, the optical member 70 is fixed to the package 10. The optical member 70 can be fixed to the lid member 15 of the package 10. The optical member 70 can be disposed on the upper surface of the package 10, in other words, the upper surface of the lid member 15.

The optical member 70 is fixed to the package 10 via the adhesives 80. The adhesives 80 are bonded to the upper surface of the package 10, and the optical member 70 is fixed by being bonded to the adhesives 80. The adhesives 80 are bonded to the package 10 and the optical member 70.

The fixing process using the adhesives 80 includes the step of bonding using the first adhesives 81 and the step of bonding using the second adhesives 82. The first adhesives 81 and the second adhesives 82 are provided at bonding positions on the package 10 for bonding with the optical member 70. At this point, the adhesives are not yet cured.

Subsequently, the first adhesives 81 are cured in a state in which the optical member 70 and the first adhesives 81 are in contact with each other, thereby bonding together the package 10 and the optical member 70 via the first adhesives 81. Thus, the first adhesives 81 is cured with the second adhesives 82 being uncured.

Note that the first adhesives 81 are used for adjusting the position and the height of the optical member 70 relative to the package 10. That is, the position and the height of the optical member 70 are adjusted relative to the package 10, and the first adhesives 81 are cured while the optical member 70 and the package 10 are held in the adjusted arrangement, thereby allowing the optical member 70 to be fixed to the package 10 with the adjusted position and height.

For example, in order to keep the optical member 70 and the package 10 in the adjusted arrangement, the package 10 is placed on the stage of a mounter apparatus, with the optical member 70 held by the collet of the mounter apparatus. A UV-curable resin enables a quick bonding process, therefore it is possible to efficiently manufacture the light-emitting device 1.

The arrangement of the optical member 70 is adjusted so that light emitted from the semiconductor laser element 20 is optically controlled with a high precision by the lens surface of the optical member 70. Therefore, the adjustment can be performed in accordance with each individual light-emitting device 1 to be manufactured. Note that the adjustment can be performed for each group of light-emitting devices 1.

Depending on the adjustment, the thickness of the interposed first adhesives 81 (i.e., the distance from the upper surface of the package 10 to the lower surface of the optical member 70) can be 200 μm or more. On the other hand, the range of irradiation of the primary portion of light is larger as the optical path length to the lens surface increases, and it is therefore preferred that the maximum thickness of the first adhesives 81 is adjusted to be 500 μm or less.

The thickness of the first adhesives 81 can be 100 μm or more even in the case in which the thickness is small. Note that the thickness of the first adhesives 81 is not limited to this, and can be 100 μm or less. The thickness of the first adhesives 81 can be 500 μm or more. While a resin adhesive such as a UV-curable resin generates an organic gas during the curing process, the lid member 15 and the optical member 70 are bonded together in a state in which the semiconductor laser elements 20 is sealed in the package 10 by the lid member 15, thereby suppressing quality degradation due to dust collection.

Subsequently, the second adhesives 82 being in contact with the optical member 70 are cured, thereby bonding together the package 10 and the optical member 70 via the second adhesives 82. Accordingly, curing of the first adhesives 81 and the second adhesives 82 is achieved.

Note that the package 10 and the optical member 70 are already fixed together by the first adhesives 81. A thermosetting resin takes a longer time for bonding than a UV-curable resin does because bonding positions for the thermosetting resin is required to be heated. However, there is no need to support the optical member 70 by a mounter apparatus; therefore, the curing process for a plurality of light-emitting devices 1 can be performed at once. After being fixed with a UV-curable resin, the light-emitting device 1 can be efficiently manufactured.

In the light-emitting device 1, light emitted through the emission surface of the package 10 to the outside is incident on the incidence surface of the optical member 70 and exits through the emission surface of the optical member 70. The adhesives 80 are bonded to the optical member 70 between the emission surface of the package 10 and the incidence surface of the optical member 70.

Similarly, the adhesives 80 are bonded to the package 10 between the emission surface of the package 10 and the incidence surface of the optical member 70. Note that another component can be further provided between the package 10 and the optical member 70, and the optical member 70 can be fixed to the package 10 with this intermediate member interposed therebetween. In this case, the adhesives 80 are bonded to the intermediate member rather than to the package 10.

The adhesives 80 are bonded to the optical member 70 without interfering with the optical path of the primary portion of light from the semiconductor laser element 20, which is emitted through the emission surface of the package 10 to be incident upon the incidence surface of the optical member 70. That is, the adhesives 80 are provided so as to avoid passage of the path of light travelling from the emission surface of the package 10 to the incidence surface of the optical member 70. Thus, it is possible to suppress degradation of the adhesives 80.

The incidence surface of the optical member 70, from which light having been emitted through the emission surface of the package 10 enters, and the emission surface of the optical member 70, through which light having passed through the incidence surface of the optical member 70 exits, are lens surfaces. Such a lens can collimate light emitted from the package 10 and emit the light from the light-emitting device 1, for example. Note that the incidence surface and the emission surface can be lens surfaces.

In the illustrated example of the light-emitting device 1, the emission surface of the optical member 70 is a lens surface. The adhesives 80 are provided along the periphery and its vicinity of the lens surface. As the light-emitting device 1 is viewed from a direction facing the emission surface, the adhesives 80, which are disposed on the package 10 before being bonded to the optical member 70, do not overlap with the lens surface of the optical member 70 after being bonded to the package 10. Note that a top view in this example means viewing the light-emitting device 1 from the direction facing the emission surface.

Figure 9:
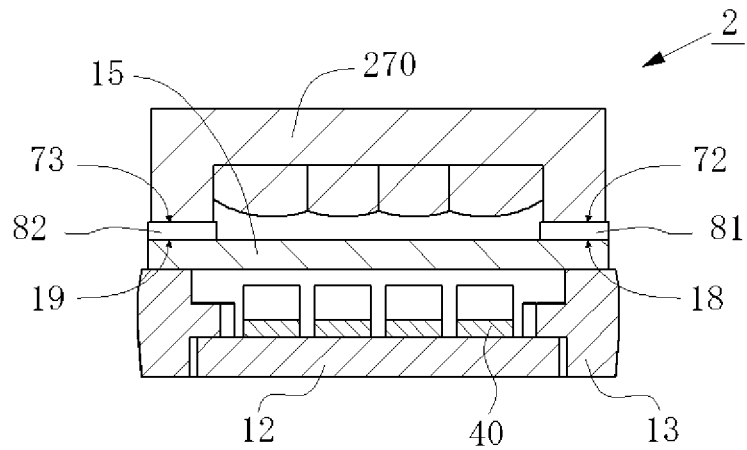
FIG. 9 is a cross-sectional view showing a variation of the light-emitting device according to the embodiment.

Note that FIG. 9 shows an example of a light-emitting device 2, wherein the incidence surface of the optical member is a lens surface. The illustrated light-emitting device 2 can be formed by using the same components as those of the illustrated light-emitting device 1 except that the shape of the optical member 270 is different from that of the optical member 70.

Herein, regions of the optical member 70 with which the adhesives 80 are in contact when the package 10 and the optical member 70 are fixed together via the adhesives 80 will be referred to as bonding regions 71. Each region with which a first adhesive 81 is in contact will be referred to as a first bonding region 72, and each region with which a second adhesive 82 is in contact will be referred to as a second bonding region 73.

Regions of the package 10 with which the adhesives 80 are in contact will also be referred to as bonding regions 17. In the illustrated example of the light-emitting device 1, the lid member 15 has bonding regions 17. Each region with which a first adhesive 81 is in contact will be referred to as a third bonding region 18, and each region with which a second adhesive 82 is in contact will be referred to as a fourth bonding region 19.

The first adhesive 81 and the second adhesive 82 are each provided at one or more positions. The optical member 70 includes a plurality of bonding regions 71 that are spaced apart from each other, in other words, that are not in contact with each other. The optical member 70 includes first bonding regions 72 and second bonding regions 73 spaced apart from each other. This similarly applies to the package 10.

Note that the above similarly applying to the package 10 means that the optical member 70 can be replaced with the package 10, the bonding region 71 with the bonding region 17, the first bonding region 72 with the third bonding region 18, and the second bonding region 73 with the fourth bonding region 19.

In the illustrated example of the light-emitting device 1, each of the first adhesives 81 and the second adhesives 82 is provided at a plurality of positions. The bonding regions 71 at their respective positions are spaced apart from each other. On the optical member 70, whose outer shape as viewed from a direction facing the incidence surface is rectangular, the first adhesives 81 are provided at diagonally-opposite corners (i.e., a first pair of corners) of the rectangular shape, and the second adhesives 82 are provided at the other diagonally-opposite corners (i.e., second pair of corners) of the rectangular shape. The first adhesives 81 are provided at two positions, in other words, the first pair of diagonally-opposite corners of the rectangular shape, and the optical member 70 accordingly includes two first bonding regions 72. The second adhesives 82 are provided at two position, in other words, the other pair of diagonally-opposite corners of the rectangular shape, and the optical member 70 accordingly includes two second bonding regions 73. Two first bonding regions 72 and two second bonding regions 73 are spaced apart from each other. Also, two first bonding regions 72 are spaced apart from each other, and two second bonding regions 73 are spaced apart from each other. This similarly applies to the package 10.

By providing the first adhesives 81 and the second adhesives 82 spaced apart from each other, when applying one adhesive 80, interference with the other adhesive 80 can be avoided. By providing the first adhesives 81 and the second adhesives 82 at respective pairs of diagonally-opposite corners, stable bonding with one adhesive 80 may be realized. Note that the first adhesives 81 and the second adhesives 82 do not need to be provided at respective pairs of diagonally-opposite corners. For example, the first adhesives 81 can be provided on at least a portion or entire of one of two opposing sides, with the second adhesives 82 provided on at least a portion or entire of the other one of the two opposing sides.

For example, there is a case in which the optical member 70 is bonded to the package 10 that does not have the lid member 15 so that the space where the semiconductor laser elements 20 are arranged is not sealed. In such a case, if the adhesives 80 are provided spaced apart from each other as described above, the space cannot be sealed. By sealing the semiconductor laser elements 20 with the lid member 15 and bonding together the lid member 15 and the optical member 70, the first adhesives 81 and the second adhesives 82 can be spaced apart from each other while suppressing quality degradation due to dust collection.

On the optical member 70, one or more first bonding regions 72 and one or more second bonding regions 73 are provided at positions that are closer to the incidence surface of the optical member 70 than to the emission surface of the optical member 70. The optical member 70 has one or more first bonding regions 72 and one or more second bonding regions 73 on a plane. When bonding the optical member 70 to a flat surface of the package 10, using a flat surface of the bonding region 71 can reduce non-uniformity in adhesive force across the bonding region.

The optical member 70 has one or more first bonding regions 72 and one or more second bonding regions 73 on the same virtual plane. This can reduce the difference between the thickness of the first adhesives 81 and the thickness of the second adhesives 82, and can reduce non-uniformity in adhesive force between the first bonding regions 72 and the second bonding regions 73.

The optical member 70 has one or more first bonding regions 72 and one or more second bonding regions 73 on a flat surface opposite from the emission surface of the optical member 70. The irradiation range of light is wider on the emission surface of the optical member 70 than on the incidence surface of the optical member 70, therefore it is preferred that the first bonding regions 72 and the second bonding regions 73 are not provided on a flat surface that is close to the emission surface of the optical member 70, e.g., a flat surface that meets the emission surface of the optical member 70.

In the illustrated example of the light-emitting device 1, the optical member 70 has one or more first bonding regions 72 and one or more second bonding regions 73 on the same plane as the incidence surface of the optical member 70. Therefore, it is possible to realize a light-emitting device having a lens surface provided on the upper surface or the emission surface, for example.

Note that in the illustrated example of the light-emitting device 2, the optical member 270 has one or more first bonding regions 72 and one or more second bonding regions 73 at positions that are closer to the emission surface of the package 10 than the incidence surface of the optical member 270. Therefore, it is possible to realize a light-emitting device having a lens surface provided on the lower surface or the incidence surface, for example.

The light-emitting device 1 includes first adhesive 81 of which the first bonding region 72 locally exist at corners of the optical member 70 and the third bonding region 17 locally exist at corners of the package 10, in a top view. The light-emitting device 1 includes first adhesive 81 of which the first bonding region 72 locally exist at corners of the optical member 70 and the third bonding region 17 do not exist at corners of the package 10, in a top view. This similarly applies to the second adhesives 82. Then, the outer shape of the optical member 70 can be made smaller than the package 10 in a top view.

The first bonding regions 72 and the second bonding regions 73 each have a circular shape. The third bonding regions 18 and the fourth bonding regions 19 each similarly have a circular shape. Note that the first adhesives 81 and the second adhesives 82 are cured in a shape that is set by being pressed between the package 10 and the optical member 70. Therefore, the "circular shape" as used herein is not limited to a circle in the strict sense.

The first bonding regions 72 have substantially the same shape and size. That is, each first bonding region 72 is formed from substantially the same amount of the first adhesive 81, and is pressed with substantially the same pressure. Note however that because of the operation of positioning of the optical member 70, they may not be pressed with strictly the same pressure. Similarly, the second bonding regions 73 have substantially the same shape and size.

The area of the first bonding region 72 is 0.5 times or more and 1.5 times or less, preferably 0.8 times or more and 1.2 times or less, than the area of the second bonding region 73. The area of the third bonding region 18 is 0.5 times or more and 1.5 times or less, preferably 0.8 times or more and 1.2 times or less, than the area of the fourth bonding region 19. Thus, by preventing the areas of two bonding regions from being significantly different from each other, the non-lens portion can be small, and a small-sized optical member 70 can be obtained.

The light-emitting device 1 includes first bonding regions 72 that partially overlap with the wiring region 14 in a top view. The light-emitting device 1 includes second bonding regions 73 that partially overlap with the wiring region 14 in a top view. This similarly applies to the third bonding regions 18 and the fourth bonding regions 19. With bonding regions of the adhesives 80 located so as to overlap with the wiring region 14, it is possible to avoid interference with light emitted from the package 10 and keep the package 10 small.

In the light-emitting device 1, none of the bonding regions of the adhesives 80 are located at a position where virtual straight lines passing through the optical axes of light emitted from the semiconductor laser elements 20 interferes, in a top view. Then, the non-lens portion can be small, and a small-sized optical member 70 can be obtained.

The shortest virtual straight line between a first bonding region 72 and a second bonding region 73 that are spaced apart from each other in the longitudinal direction of the package 10 meets any of virtual straight lines that pass through optical axes of lights emitted from the semiconductor laser elements 20, in a top view. The shortest virtual straight line between a first bonding region 72 and a second bonding region 73 that are spaced apart from each other in the width direction of the package 10 meets none of virtual straight lines that pass through optical axes of lights emitted from the semiconductor laser elements 20, in a top view.

The first bonding region 72 and the second bonding region 73 of the optical member 70 may be translucent. A plurality of first bonding regions 72 and a plurality of second bonding regions 73 may be translucent. All the bonding regions 71 of the optical member 70 may be translucent. Note that not all but one or more first bonding regions 72 and one or more second bonding regions 73 of the optical member 70 may be translucent. This similarly applies to the package 10.

A portion of the optical member 70 of the light-emitting device 1 that is defined by the passage of a collection of virtual straight lines that pass through the first bonding region 72 and extend in the direction perpendicular to the first bonding region 72 may be translucent. This portion encompasses all the straight lines that pass through the first bonding region 72. A portion of the optical member 70 that is defined by the passage of such a collection of virtual straight lines where the first bonding region 72 is replaced with the third bonding region 18 may be translucent.

This similarly applies to the second bonding region 73. That is, a portion of the optical member 70 of the light-emitting device 1 that is defined by the passage of a collection of virtual straight lines that pass through the second bonding region 73 while extending in the direction perpendicular to the second bonding region 73 may be translucent. A portion of the optical member 70 that is defined by the passage of such a collection of virtual straight lines where the second bonding region 73 is replaced with the fourth bonding region 19 may be translucent.

For example, in the illustrated example of the light-emitting device 1, the first bonding regions 72 and the second bonding regions 73 are provided on a flat surface. Therefore, the portion that is defined by the passage of a collection of virtual straight lines that pass through the first bonding region 72 while extending in the direction perpendicular to the plane including the first bonding region 72 may be translucent, and the portion that is defined by the passage of a collection of virtual straight lines that pass through the second bonding region 73 while extending in the direction perpendicular to the plane including the second bonding region 73 may be translucent. In FIG. 5, areas that overlap with the bonding regions 71 denote these portions.

Thus, the bonding regions 71 of the optical member 70 transmit light, therefore light that enters through the emission surface of the optical member 70 can pass through the optical member 70 to be incident upon the adhesive 80. For example, in the space where the light-emitting device 1 is installed, return light of the light emitted from the light-emitting device 1, light emitted from another light-emitting device, etc., may be incident upon the adhesive 80.

A portion of the lid member 15 of the light-emitting device 1 that is defined by the passage of a collection of virtual straight lines that pass through the third bonding region 18 while extending in the direction perpendicular to the third bonding region 18 may be translucent, except for the metal film 16. This portion encompasses all the straight lines that pass through the first bonding region 72. A portion of the lid member 15 that is defined by the passage of such a collection of virtual straight lines where the third bonding region 18 is replaced with the first bonding region 72 may be translucent, except for the metal film 16.

In the lid member 15 of the light-emitting device 1, a collection of virtual straight lines that pass through the third bonding region 18 while extending in the direction perpendicular to the third bonding region 18 pass through the metal film 16. Such a collection of virtual straight lines that are defined when the third bonding region 18 is replaced with the first bonding region 72 pass through the metal film 16. This similarly applies to the fourth bonding region 19. This similarly applies to the case in which the fourth bonding region 19 is replaced with the second bonding region 73.

As described above, the bonding regions 17 of the lid member 15 transmit light, therefore light reflected by the metal film 16 of the lid member 15 can pass through the lid member 15 to be incident upon the adhesive 80. For example, in the space where the light-emitting device 1 is installed, return light of the light emitted from the light-emitting device 1, light emitted from another light-emitting device, etc., may be incident on the metal film 16 and be further incident on the adhesive 80.

As the light-emitting device 1 is viewed from the direction facing the emission surface, the bonding region 71 and the bonding region 17 corresponding to the adhesive 80 provided at one position overlap with the metal film 16. At least for the bonding region 71 at one position, the overlapping region occupies 50% or more of the bonding region 71. At least for the bonding region 17 at one position, the overlapping region occupies 50% or more of the bonding region 17.

In FIG. 6, this is represented by the overlap between two hatched regions. In the illustrated example of the light-emitting device 1, in a top view (i.e., viewed from a direction facing the emission surface), 70% or more of the bonding regions 71 corresponding to two adhesives 80 that are provided at corners of the package 10 (one is the first bonding region 72 and the other is the second bonding region 73) and 70% or more of the bonding regions 17 corresponding to the two adhesives 80 (one is the third bonding region 18 and the other is the fourth bonding region 19) overlap with the metal film 16.

For any bonding region 71 and any bonding region 17, 20% or more overlaps with the metal film 16. In the illustrated example of the light-emitting device 1, 30% or more of the bonding regions 71 corresponding to two adhesives 80 that are provided at positions away from corners of the package 10 (one is the first bonding region 72 and the other is the second bonding region 73) and 30% or more of the bonding regions 17 corresponding to the two adhesives 80 (one is the third bonding region 18 and the other is the fourth bonding region 19) overlap with the metal film 16.

In this region, the optical member 70 and the lid member 15 may be translucent over the extent from the optical member 70 to the metal film 16. In FIG. 6, this extent is represented by the portion that overlaps with the overlap between two hatched regions. The adhesives 80 also transmit light to some degree. For example, the first adhesives 81 have a transmittance of more than 0% and 10% or less at the time when the light-emitting device 1 is manufactured. The second adhesives 82 have a transmittance of 80% or more and less than 100%.

With such positioning of the adhesives 80, and with the use of the second adhesives 82 having a better resistance to light than the first adhesives 81, it is possible to maintain stable adhesion between the package 10 and the optical member 70 even when the first adhesives 81 degrade by the influence of return light, etc., and the adhesive force of the first adhesives 81 becomes insufficient.

Figure 10:
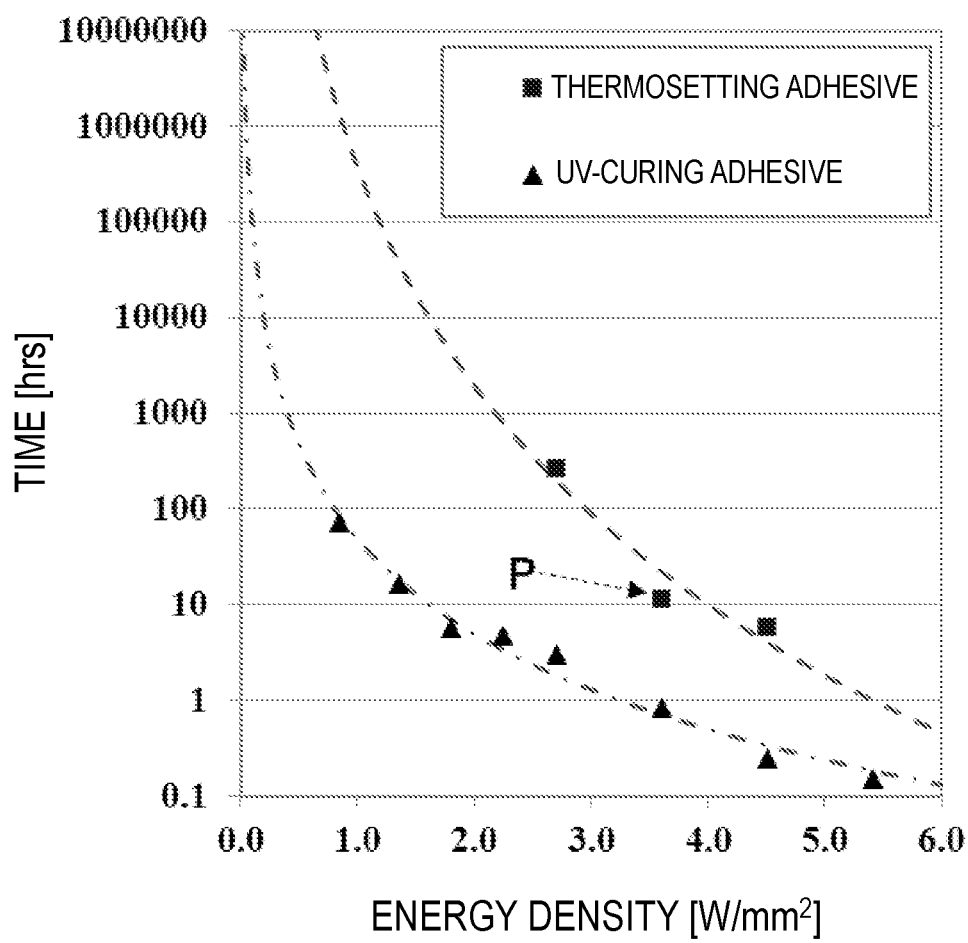
FIG. 10 is a graph showing the results of an experiment in which the resistance to light was measured for adhesives.

FIG. 10 shows the results of an experiment in which an optical member is arranged on a metal while being bonded to the metal using the first adhesive and the second adhesive, and a laser beam is emitted from above to be incident on each adhesive through the optical member for amount of time so that the adhesive is burned. FIG. 10 is a graph showing the correlation between the energy density [W/mm$^2$] of light irradiating the adhesive and the amount of time [hours] taken until the adhesive is charred.

Note that in this experiment, a thermocouple was attached in the vicinity of the adhesive to measure the change in the temperature of the thermocouple. The temperature was adjusted while taking into consideration the actual circumstances where the light-emitting device 1 is operated. As a result of the measurement, at one point, the temperature of the thermocouple started increasing rapidly from a stable state, exhibiting a temperature increase of 2 to 3 degrees or more. Then, the bonding portion was observed to find that the adhesive had turned black.

Figure 11:
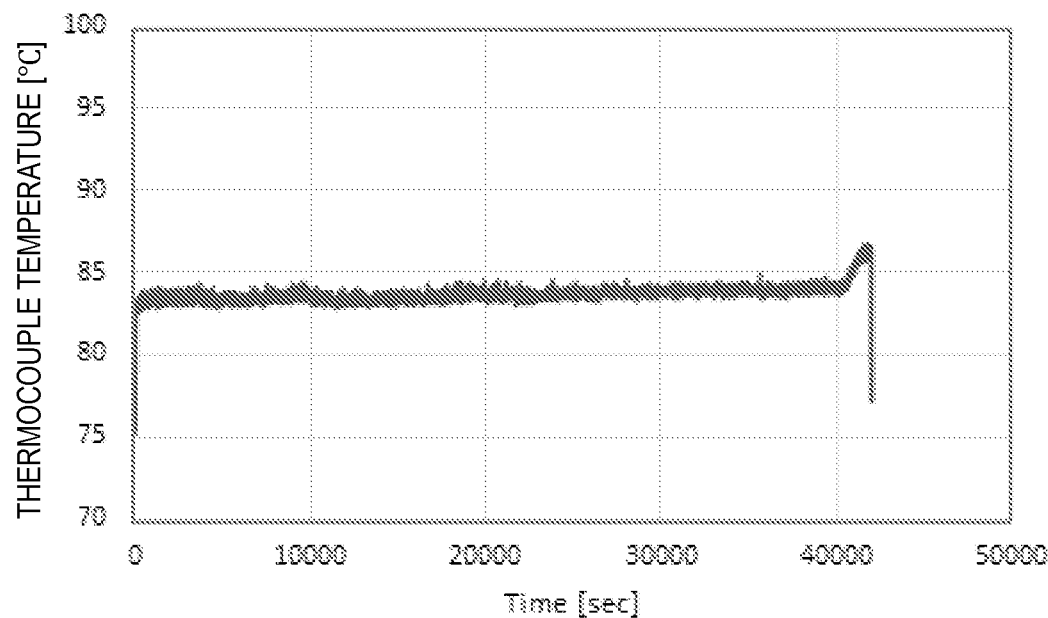
FIG. 11 is a graph showing the results of an experiment in which the resistance of an adhesive with respect to light was measured.
Figure 12:
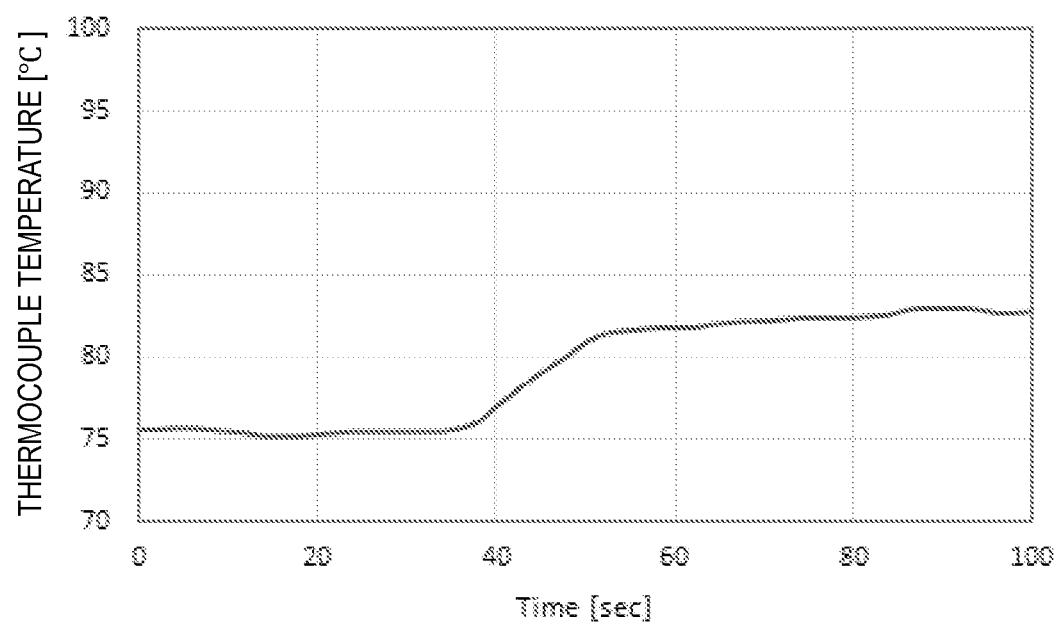
FIG. 12 is a graph showing the results of an experiment in which the resistance of an adhesive with respect to light was measured.
Figure 13:
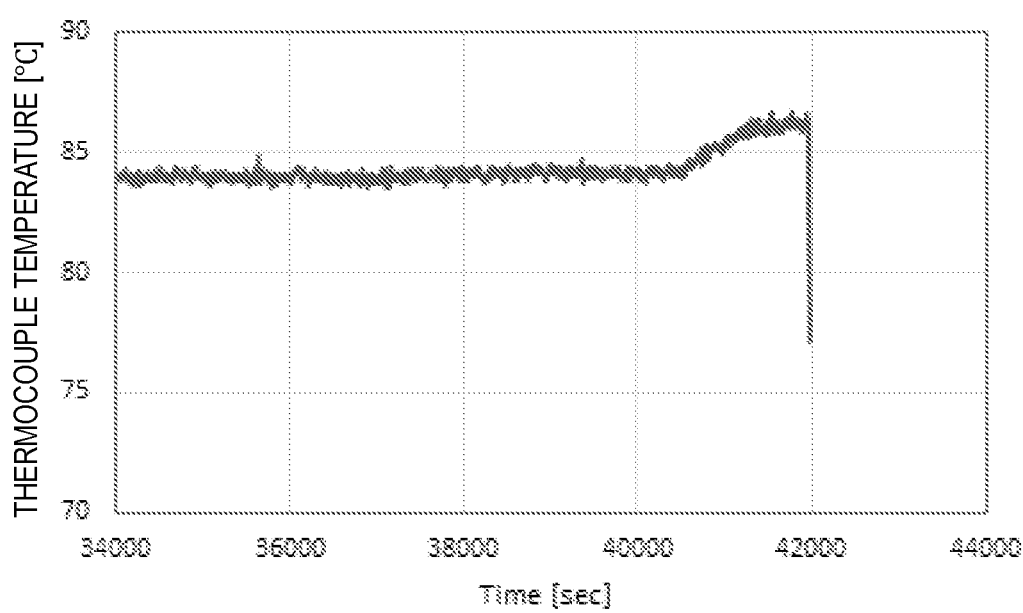
FIG. 13 is a graph showing the results of an experiment in which the resistance of adhesive with respect to light was measured.

Now, FIG. 11 to FIG. 13 show the measurement result at plot P shown in FIG. 10. Before the start of this measurement, the temperature around the bonding portion was adjusted to 75 degrees. The measurement was started and it was confirmed that the temperature of the thermocouple became stable at around 75 degrees, after which a laser beam was emitted. As shown in FIG. 12, the emission of a laser beam was started after 30 to 40 seconds from the start of the measurement, thereby increasing the temperature of the thermocouple to around 82 degrees.

The temperature increase due to the laser beam irradiation became mild, and the temperature became stable, at around 82 degrees. Note that as shown in FIG. 11, the temperature increases slightly over the course of a long period of time. Then, after around 40,000 seconds, the stable state changed and the temperature started increasing rapidly. The measurement was ended at 42,000 seconds, at which it was confirmed that the adhesive had turned black.

It was assumed from this result that the temperature of the adhesive increased by being irradiated with light, and the adhesive was charred. It was assumed that the point in time when the temperature of the thermocouple started increasing rapidly from a stable state was the point in time when the burning of the adhesive started, and therefore the irradiation time up to this point is represented as the amount of time taken until the adhesive is burned in the experiment results of FIG. 10.

As can be seen from the results of FIG. 10, the first adhesive is burned within 100 hours by being irradiated with light having an energy density of 1.0 [W/mm$^2$]. Depending on the product incorporating the light-emitting device, the light-emitting device may be required to have a better resistance to light than this.

It can be seen that the second adhesive has a better resistance to light than the first adhesive does. Therefore, even when the first adhesive 81 is charred and loses its adhesive force, the optical member 70 remains fixed in the light-emitting device 1. Thus, it is possible to realize a light-emitting device 1 that has stable adhesion even after being used over a long time.

Note that the first adhesive 81 and the second adhesive 82 are not limited to those used in the experiment but can each be any adhesive appropriately selected. Based on the experiment results, example combinations of the first adhesive 81 and the second adhesive 82 to be employed for the light-emitting device 1 include the following.

For example, a possible combination is a first adhesive 81 that is charred within 10 hours by being irradiated with light of a predetermined energy density and a second adhesive 82 that is not charred after 100 hours. Note that in the experiment of FIG. 10, a first adhesive was charred in 3 hours by being irradiated with light having an energy density of 2.7 [$W/mm^2$], whereas a second adhesive was not charred even after 250 hours.

For example, another possible combination is a first adhesive 81 that is charred within 1 hour by being irradiated with light of a predetermined energy density and a second adhesive 82 that is not charred in 10 hours. In the experiment of FIG. 10, a first adhesive was charred in 50 minutes by being irradiated with light having an energy density of 3.6 [$W/mm^2$], whereas a second adhesive was not charred even after 11 hours.

For example, yet another possible combination is a first adhesive 81 that is charred within 30 minutes by being irradiated with light of a predetermined energy density and a second adhesive 82 that is not charred in 5 hours. In the experiment of FIG. 10, a first adhesive was charred in 15 minutes by being irradiated with light having an energy density of 4.5 [$W/mm^2$], whereas a second adhesive was not charred even after 5 hours.

The second adhesive 82 has a better resistance to light than the first adhesive 81 at least for irradiation with light in the energy density range of 5.0 [$W/mm^2$] or less. Note that depending on the environment in which the light-emitting device 1 is installed, the second adhesive 82 can have a better resistance to light than the first adhesive 81 does at least for irradiation with light in the energy density range of 1.0 [$W/mm^2$] or less.

Note that with the light-emitting device 1, the first adhesive 81 is more advantageous over the second adhesive 82 for some point, e.g., having an advantageous effect that cannot be achieved, or cannot be easily achieved, by the second adhesive 82, or having an advantageous effect such that attempting to achieve the same advantageous effect with the second adhesive 82 would lower the efficiency. For example, with the light-emitting device 1, the first adhesive 81 is used in order to efficiently bond the optical member 70 that has been positioned.

While embodiment of the present invention have been described above, the light-emitting device of the present invention is not strictly limited to the embodiments above. That is, the present invention can be embodied without limitation to the outer shape and the structure of the light-emitting devices described above. It is also not required that all of the components of the described embodiments be provided. For example, where a claim does not recite some of the components of the light-emitting device included in the embodiments above, the claimed invention is applicable with some degree of design freedom allowed for a person of ordinary skill in the art to make replacement, omission, change in shape, and/or change in material for those unrecited components.

The light-emitting devices described above are applicable to projectors, headlights for vehicles, head mounted displays, lighting fixtures, displays, etc.

What is claimed is:

1. A light-emitting device comprising:
a plurality of semiconductor laser elements;
a package having a hermetically sealed space, with the plurality of semiconductor laser elements arranged in the space;
an optical member fixed to the package; and
a plurality of adhesives including a first adhesive and a second adhesive fixing the optical member to the package, wherein:
the package has an emission surface through which light from the plurality of semiconductor laser elements exits the package;
the optical member has an incidence surface on which the light exiting the package enters the optical member, and an emission surface from which the light that has entered the optical member exits the optical member;
the plurality of adhesives are bonded to the optical member between the emission surface of the package and the incidence surface or a lower surface of the optical member, the lower surface of the optical member being lower than the incidence surface;
in the optical member, one or more first bonding regions to which the first adhesive is bonded and one or more second bonding regions to which the second adhesive is bonded
are located at positions that are closer to the incidence surface of the optical member than to the emission surface of the optical member;
in a top view, the plurality of adhesives exist at four corners of the optical member; and
in the top view, the plurality of adhesives exist at two corners out of four corners of the package but do not exist at the remaining two corners.

2. The light-emitting device according to claim 1, wherein the plurality of semiconductor laser elements include one or more semiconductor laser elements that emit blue light.

3. The light-emitting device according to claim 1, wherein the plurality of semiconductor laser elements are electrically connected in series.

4. The light-emitting device according to claim 1, wherein a thickness of the first adhesive is not less than 100 μm and not more than 500 μm.

5. The light-emitting device according to claim 1, wherein a thickness of the first adhesive is not less than 500 μm.

6. The light-emitting device according to claim 1, wherein the first adhesive is charred within 10 hours by being irradiated with light of a predetermined energy density, and the second adhesive is not charred within 100 hours by being irradiated with light of the predetermined energy density.

7. The light-emitting device according to claim 6, wherein the predetermined energy density is 2.7 $W/mm^2$.

8. The light-emitting device according to claim 1, wherein the first adhesive is charred within 1 hour by being irradiated with light of a predetermined energy density, and the second adhesive is not charred within 10 hours by being irradiated with light of the predetermined energy density.

9. The light-emitting device according to claim 8, wherein the predetermined energy density is 3.6 $W/mm^2$.

10. The light-emitting device according to claim 1, wherein the first adhesive is charred within 30 minutes by being irradiated with light of a predetermined energy density, and the second adhesive is not charred within 5 hours by being irradiated with light of the predetermined energy density.

11. The light-emitting device according to claim 10, wherein the predetermined energy density is 4.5 W/mm$^2$.

12. The light-emitting device according to claim 1, wherein an adhesive type of the first adhesive is different from an adhesive type of the second adhesive.

13. The light-emitting device according to claim 12, wherein:
   the first adhesive is a UV-curable resin; and
   the second adhesive is a thermosetting resin.

* * * * *